United States Patent [19]

Berman

[11] Patent Number: 5,014,737
[45] Date of Patent: May 14, 1991

[54] QUARTZ INTEGRATED TROUGH/SUMP RECIRCULATING FILTERED HIGH-PURITY CHEMICAL BATH

[76] Inventor: Allan Berman, 1295 Forgewood Ave., Sunnyvale, Calif. 94089

[21] Appl. No.: 434,709

[22] Filed: Nov. 13, 1989

[51] Int. Cl.$^5$ .............................................. E03B 7/07
[52] U.S. Cl. .................... 137/334; 137/341; 137/563; 137/565; 137/574
[58] Field of Search .............. 137/571, 573, 574, 563, 137/565, 341, 334

[56] References Cited

U.S. PATENT DOCUMENTS

| | | | |
|---|---|---|---|
| 1,750,245 | 3/1930 | Schwedler | 137/341 |
| 3,033,712 | 5/1962 | Brevilc | 137/574 |
| 3,851,662 | 12/1974 | Jesson | 137/563 |
| 3,987,816 | 10/1976 | Lange | 137/563 |
| 4,090,530 | 5/1978 | Longe | 137/574 |
| 4,135,530 | 1/1979 | Cheney | 137/565 |
| 4,804,990 | 2/1989 | Jessop | 137/565 |

*Primary Examiner*—A. Michael Chambers
*Attorney, Agent, or Firm*—Harris Zimmerman

[57] ABSTRACT

A recirculating chemical bath arrangement includes a quartz process tank, and a sump chamber disposed directly adjacent to the process tank. A trough extends about the top portion of the outer walls of the process tank, the trough being inclined to cause gravital flow toward the sump chamber. The sump chamber includes a fitting in the bottom thereof which directs liquid from the sump into a pump/filter circuit, the output of which is fed into the bottom of the process tank. The liquid is thus caused to overflow the process tank and spill into the trough, and flow into the adjacent sump chamber. A plurality of heater units are secured to the exterior surface of the process tank to heat the liquid therein to the proper process temperature. The sump chamber is unheated, so that the liquid entering the pump/filter is at the coolest temperature of the liquid flow cycle. The process tank and sump chamber may be formed integrally of molded and welded quartz plates, and disposed within an outer case that contains thermal insulation.

8 Claims, 3 Drawing Sheets

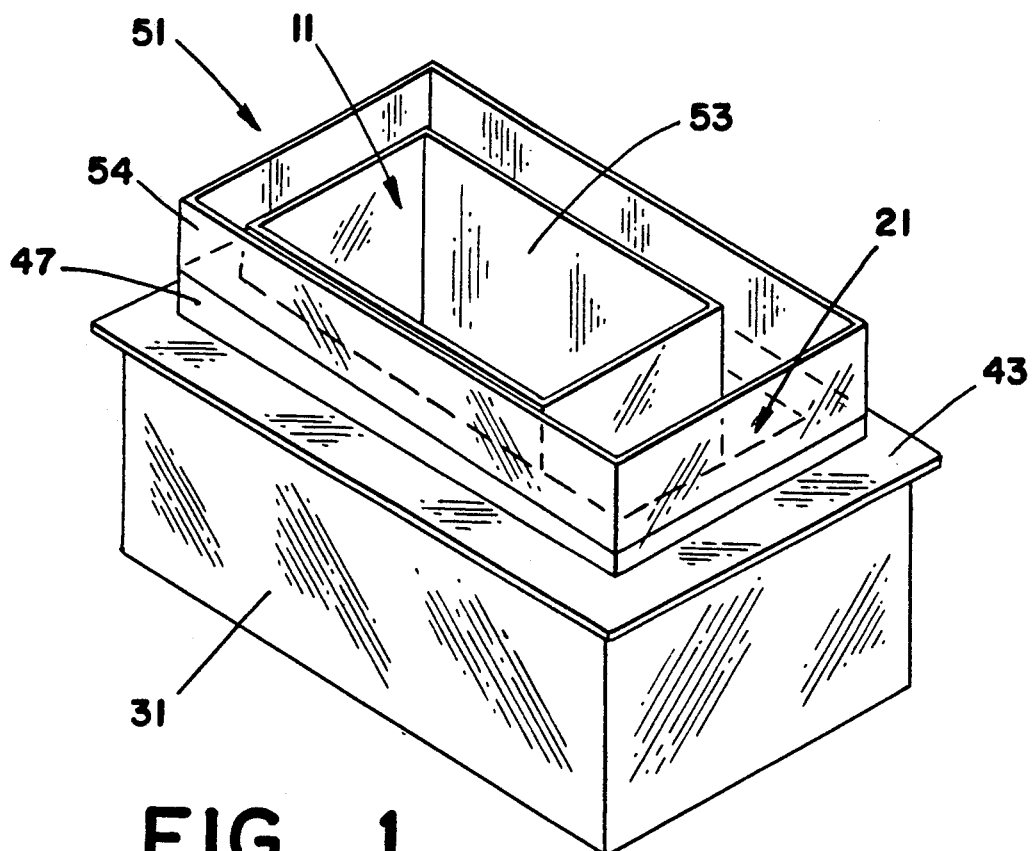
FIG_1
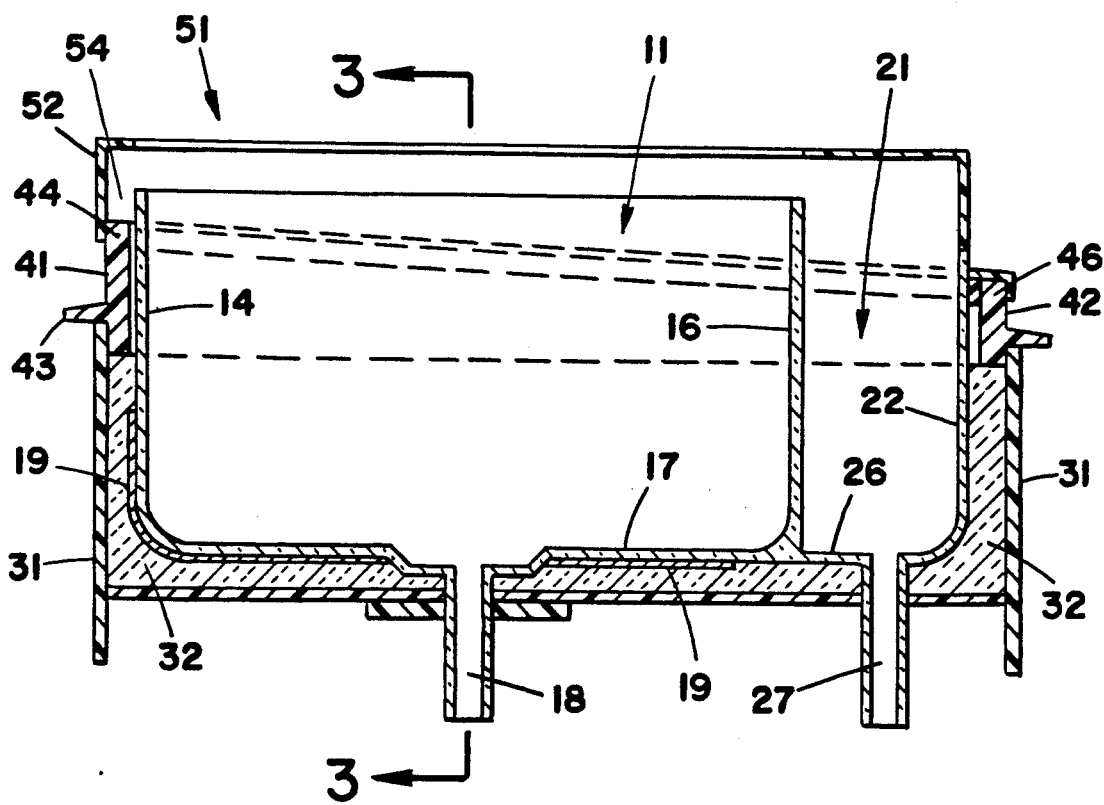
FIG_2

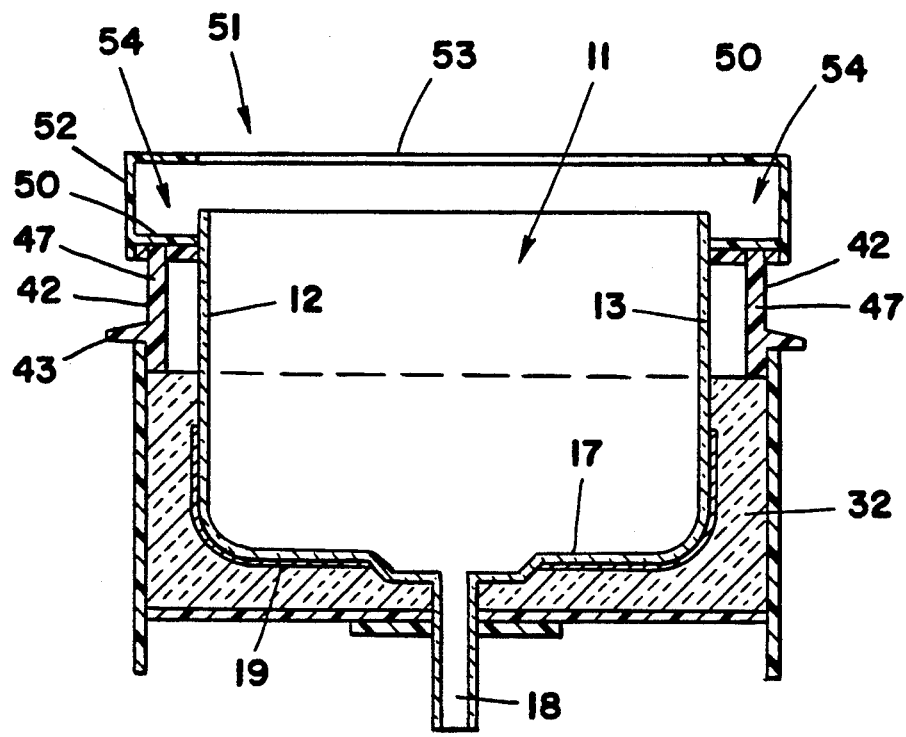
FIG_3
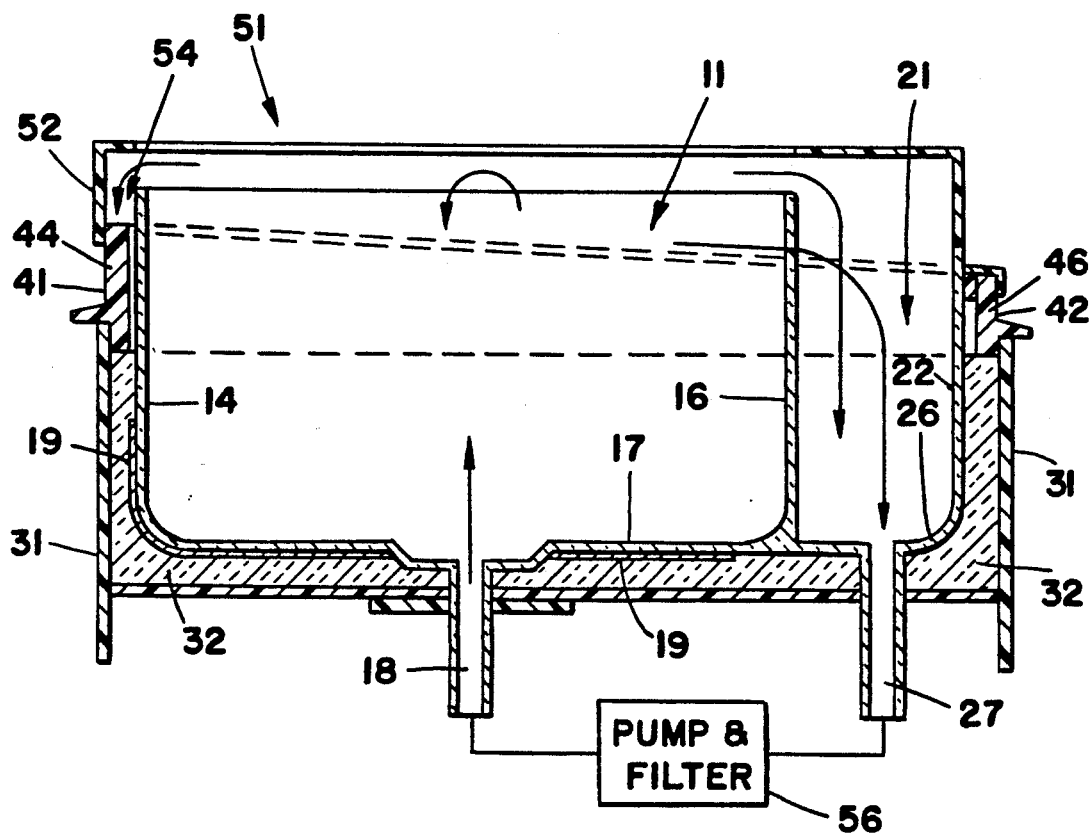
FIG_4

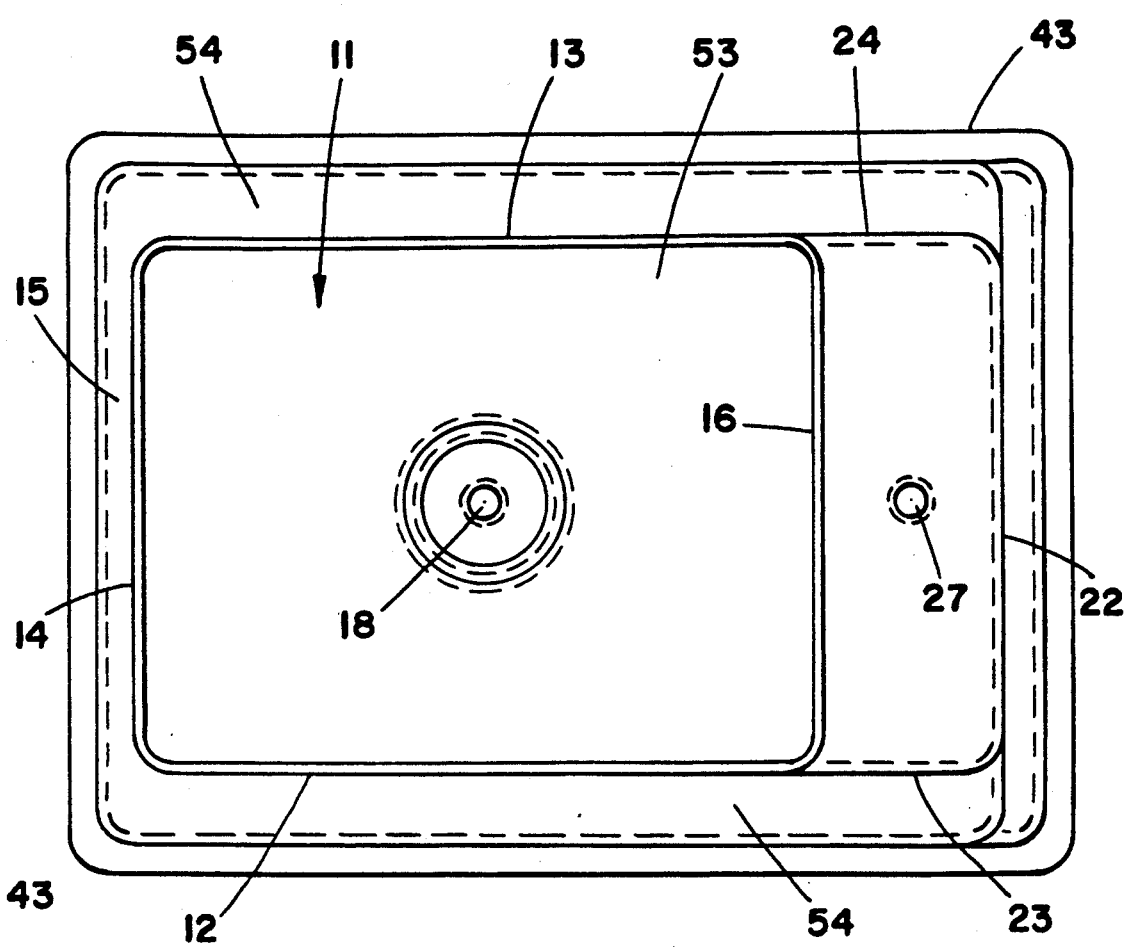
FIG_5
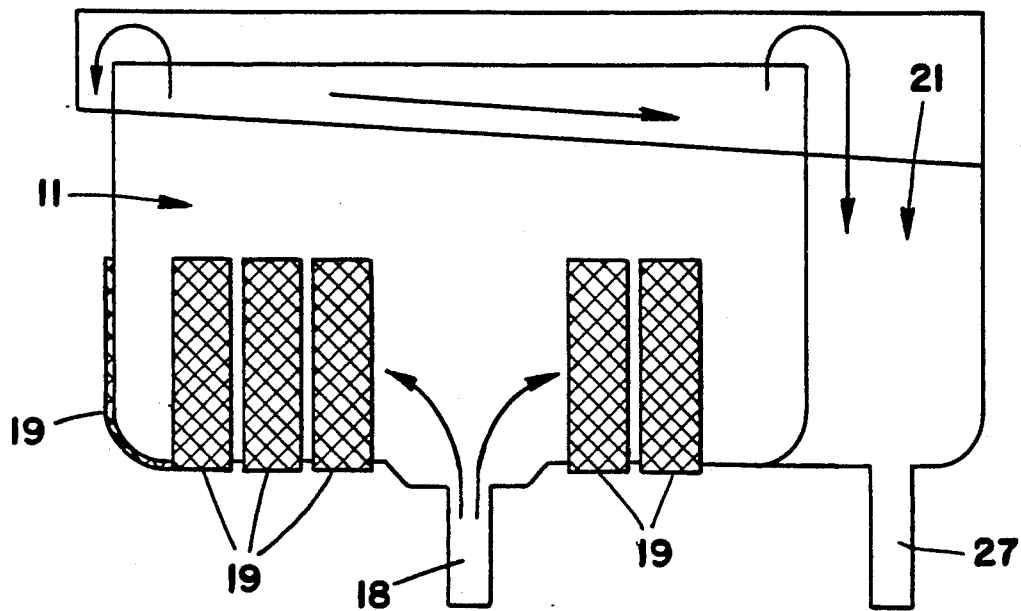
FIG_6

QUARTZ INTEGRATED TROUGH/SUMP RECIRCULATING FILTERED HIGH-PURITY CHEMICAL BATH

BACKGROUND OF THE INVENTION

Various applications, particularly those used for wafer etching and cleaning in the semiconductor industry, require high levels of liquid chemical purity during production processing. These chemicals are often volatile, corrosive, and unstable. To reduce contaminating particulates, many generated during the production process itself as well as in the initial chemical charge, various in-process recirculating filtering arrangements have evolved in the prior art. These units are primarily constructed of plastic and use heaters immersed directly in the working chemistry.

However, as the semiconductor process industry turned to more aggressive chemistries, used at higher temperatures and requiring higher purity levels, there evolved a need for new containment structures to withstand these conditions and deliver the requisite purity levels. This need was filled by the development of quartz chambers as the basic containment vessel, with through-the-wall heating to achieve more even temperature distribution and reduce heater failure through exposure to the chemical solutions. Along with this development came the belief in the process industry that the chemical solution should enter and flow upward from the bottom of the containment vessel, through the array of wafers being processed, and out over a weir at the top of the vessel, so that process-generated particles could be filtered out before the solution re-entered the vessel.

Prior art quartz recirculating baths are divided into two general approaches. One version consists of a quartz working vessel supported inside a larger quartz outer vessel. Heaters are secured to the outside of the outer vessel wall to heat the liquid contained between the walls of the two vessels. The top edge of the outer vessel terminates in an outward-facing quartz flange which is sealed to a plastic outer case. The outer case is packed with thermal insulation, and also serves to protect the heaters from the chemical solutions. The inner vessel contains the working load of wafers. The filtered chemistry is introduced through fittings passing through the bottom of the outer vessel in sealed fashion to an opening in the bottom of the inner vessel. The flow path passes through the wafer array, over the four sides of the top lip of the inner vessel and down the outer surface of the inner vessel to form a reservoir pool of liquid between the inner and outer vessel walls.

The liquid in the reservoir absorbs heat conducted from the heaters through the outer wall. A fitting at the bottom of the outer tank draws off the liquid to a pump/filter fluid circuit. While this system provides highly efficient flow, it suffers from having the heat put into the solution just before entering the pump/filter, and then returning the filtrate to the tank at its lowest temperature. The pump, being the most heat-limited component of the typical recirculating system, receives the recirculating liquid at its hottest, and the wafers receive the liquid at its coolest. This arrangement shortens the mean time between repairs, and is also wasteful of power.

In addition, the performance of this system is very sensitive to the amount of liquid in the system. The inter-wall reservoir has a tall, narrow effective cross-section, and any liquid removed from the system by evaporation, "drag out" on the wafers, or leakage, results immediately in a significant reduction of the liquid level between the walls of the two quartz containers. Variations in liquid level can have a profound effect on the heat transfer into the liquid through the outer wall. More importantly, the liquid level may drop below the height of the heater placement, causing local heat build-up in the heater leading to early bath failure and possible fire conditions. The monitoring of the liquid level between the walls of this type of bath must be rigorous and provision must be made for make-up chemistry on a frequent basis.

The second common recirculating bath design employs a single working vessel, and a trough secured near the top of the outer surface of the vessel walls. The trough is exposed at the top to the local environment on three sides, and the bottom of the trough forms a seal with a plastic outer case and heating chamber within the outer case. Heaters are mounted within the outer case, on the outer surface of the working vessel, and insulation is packed into the outer case to retain heat. Liquid flows up from the bottom of the vessel, over its upper lip on four sides, and down into the shallow sloped trough where it is carried to a pick-up fitting, collected and plumbed back into the pump/filter circuit, and thence to the bottom of the working vessel, where it is heated. This arrangement has the advantage of heating the chemistry as it returns from the filter, so that the pump receives the liquid at its closest temperature. For low-flow systems, this system works quite well.

The second bath design encounters problems at high liquid flow rates, such as standing waves or turbulence in the liquid in the trough. Standing waves can deprive the pump of liquid, and turbulence can homogenize air into the returning liquid. Entrained air can seriously affect both pumping and filtering functions. Moreover, when a comparatively small amount of liquid is lost from the system, the liquid level falls in the trough and air can be drawn into the pickup fitting and thence into the pump. This problem is exacerbated by a vortexing phenomenon caused by high flow rates at the pickup fitting which can both block liquid flow to the pump and cause air ingestion, even though the trough liquid level would otherwise be sufficient to feed the pump intake.

SUMMARY OF THE PRESENT INVENTION

The present invention generally comprises a recirculating chemical bath arrangement which is designed to overcome the deficiencies described above with regard to the two basic forms of quartz tank recirculating systems. The invention includes a quartz process tank having a trough extending about the top portion of the outer walls of the tank. The system also includes a pump/filter circuit which pumps the chemical solution into the bottom of the process tank, the liquid flowing over the tank walls into the trough, as described previously. Also, the process tank is provided with heater units secured to outer surface thereof. However, rather than connecting the pump/filter input directly to the trough, the invention provides a second, smaller chamber secured to the end of the process tank and disposed to receive liquid flow from the trough as well as from the process tank. The second chamber includes a fitting at the bottom thereof to supply liquid to the pump/filter circuit.

The second chamber forms a reservoir and sump for the liquid, and the second chamber need not be heated. Liquid flowing up over the walls of the tank flow down the trough channels into the sump. The standing waves and turbulence of the prior art trough systems are eliminated in the quiet containment of the sump. The standing liquid in the sump also provides an opportunity for homogenized air to separate and disperse from the liquid. The trough channels, feeding in from the sides of the sump, do not re-entrain the separating vapor from the liquid. The height of the liquid in the sump eliminates the generation of pump-starving vortices and air ingestion. While the level of the chemical solutions in the second chamber will be affected by the loss of liquid from the system, flow rates in the process tank and the troughs are not affected, due to the reservoir function of the sump. By maintaining the liquid level in the process tank, the system avoids any problems due to exposure of the heated quartz surfaces. Moreover, the liquid entering the pump/filter circuit is at its coolest temperature, and the liquid is heated by contact with the heated surfaces of the process tank prior to its passage through the array of wafers being treated.

The system also includes an outer case which encloses the side and bottom of the process tank and second, sump chamber. The case is formed of chemically inert plastic or the like and packed with thermal insulation to retain heat and maintain the operating temperature of the system and solution. The trough assembly is integral with the process tank and supported atop the outer walls of the outer case.

BRIEF DESCRIPTION OF THE DRAWING

FIG. 1 is a perspective view of the integrated trough-/sump quartz recirculating, filtered chemical bath of the present invention.

FIG. 2 is a cross-sectional side elevation of the integrated trough/sump quartz recirculating, filtered chemical bath shown in FIG. 1.

FIG. 3 is a cross-sectional end elevation of the integrated trough/sump quartz recirculating, filtered chemical bath of FIGS. 1 and 2, taken along line 3—3 of FIG. 2.

FIG. 4 is a cross-sectional side elevation of the integrated trough/sump quartz recirculating, filtered chemical bath of FIGS. 1 and 2.

FIG. 5 is a top view of the invention as depicted in FIGS. 1-4.

FIG. 6 is a schematic view showing the placement of the heater units with respect to the process tank and sump.

DESCRIPTION OF THE PREFERRED EMBODIMENT

The present invention generally comprises an immersion processing apparatus for treating components, such as integrated circuits wafers, in a high purity, chemical bath. The invention features an integrated trough/sump construction to provide improved temperature uniformity and purity in the recirculated solution, and extended life of the pump and filter system that recirculate the solution.

With reference to the accompanying Figures, the invention includes a process vessel 11 for containing a flowing chemical solution and items, such as integrated circuit wafers, to be treated by immersion in the solution. The vessel 11 is comprised of opposed, parallel side walls 12 and 13, and opposed parallel end walls 14 and 16 joining the side walls. A bottom wall 17 joins the bottom edges of the side and end walls to form a rectangular, upwardly opening coffer. The walls are preferably formed of quartz plates molded and welded together to form a leakproof container that is impervious to virtually all substances required for treatment of integrated circuit wafers. The quartz material is also extremely stable and chemically inert at elevated temperatures. A fluid fitting 18 extends through the medial portion of the bottom panel 17. A plurality of heater strips 19 are secured to the outer surface of the side, end, and bottom walls of the vessel 11. The heater strips 19 apply thermal energy to the outside of the vessel 11 which is conducted through the process tank walls to heat the liquid solution within the vessel. The placement and number of the heater strips is a function of the size and configuration of the vessel 11.

Directly adjacent to the vessel 11 is an integrated sump chamber 21. The sump chamber 21 is comprised of the vessel wall 16, an end wall 22 extending parallel and spaced apart therefrom, and opposed, parallel side walls 23 and 24. A bottom wall 26 joins the lower edges of the walls 16, 22-24 to form a second rectangular coffer opening upwardly. It should be noted that the walls 22-24 do not extend as high as the walls of the vessel 11, for reasons to be made apparent in the following description. A drain fitting 27 extends through a medial portion of the bottom wall 26. The walls 22-24 and 26 are also formed of quartz plates welded together to form a sealed sump that is virtually integrally formed with the vessel 11.

The invention further includes a housing 31, comprising a rectangular case formed of a non-reactive, flame retardant material such as polypropylene or the like. The case includes an open upper end, and is dimensioned to receive therein the integrated assembly of the vessel 11 sump chamber 21 with space between the integrated assembly and the interior surfaces of the case 31. The volume between the case and the integrated assembly is packed with a thermal insulation 32 such as an alumina-silicate material known in the prior art, or the like. It should be noted that the side walls and end walls of the case 31 are lower in height than the side walls and end walls of the vessel 11.

A further component of the invention is a rim assembly 41, comprising a continuous wall 42 configured to fit intimally within the contours of the case 31 and circumscribe the integrated vessel-sump assembly. A flange 43 extends outwardly from the wall 42 and extends continuously thereabout. A sealant material 50 is disposed to join the flange and wall 42, and extends continuously with the flange. The flange 43 is disposed to impinge upon the upper edge of the case 31 and be supported thereby. It should be noted that the wall 42 varies in height, with the portion 44 adjacent to the end wall 14 having the greatest height, the portion 46 adjacent to the end wall 22 having the least height, and the portions 47 adjacent to the side walls 12 and 13 extending obliquely therebetween to form a ramped surface. The rim assembly may also be formed of inert, flame retardant material, such as polypropylene or the like.

Secured atop the rim assembly 41 is a cover assembly 51. The cover assembly 51 is generally configured as a rectangular coffer opening downwardly and dimensioned to be received atop the rim assembly 41. The cover assembly includes a lateral panel 53 disposed atop the upper edge of the wall 42 and inclined therewith. The lateral panel 53 includes a central cutout therein dimensioned to receive therethrough the upper extent of the integrated vessel-sump assembly, and sealant is disposed continuously about the junction of the cutout and the outer surface of the integrated assembly. A side wall 52, having a rectangular configuration slightly larger in width and length than the rim assembly 41, is disposed to circumscribe the outer extent of the panel 53 and form therewith a channel-like trough 54 extending about the end wall 14 and side walls 12 and 13 of the vessel 11.

It may be appreciated that the side portions of the trough 54 are inclined downwardly toward the sump 21, and that all liquid upwelling from the vessel 11 and overflowing the sides and end wall 14 thereof is collected in the trough 54 and caused to flow gravitally into the sump 21. As depicted in FIG. 4, the fitting 27 is connected to the input of a pump/filter fluid circuit 56, which has an output connected to the fitting 18 of the vessel 11. Thus all liquid collected in the sump 21 is filtered and returned to the bottom of the vessel 11, where it is heated by contact with the heated bottom and side walls of the vessel 11. The liquid flows upwardly through the array of wafers or the like being treated, over the upper edge of the vessel walls and into the trough 54, and thence back to the sump. It should be noted that the heat provided by the strips 19 is retained within the invention by the insulation 32, which also helps to maintain a uniform temperature within the liquid.

It should be appreciated that the liquid within the sump is at the coolest temperature in the entire flow cycle, due to its progress down the unheated trough and its standing within the unheated sump 21. Thus the pump/filter circuit receives the process solution at its lowest temperature, reducing wear and stress on the pump and filter and prolonging their useful life. The liquid standing in the sump eliminates the possibility of pump starvation due to low liquid level, and prevents the development of vortices at the pump intake, which could otherwise also cause pump starvation. Indeed, the overall design of the invention achieves the following advantages:

greater stability of performance;
elimination of turbulence, air ingestion, and pump starvation;
a great reduction in the need for accurate liquid level monitoring;
increased safety and MTBF because of innate heater protection;
increased safety and life of filter circuit components because of optimal point of heat introduction;
capability for both high and low flow rate circulation; and
good power efficiency.

I claim:

1. A recirculating, high purity chemical bath, including a first vessel for containing a liquid chemical bath, heater means for transmitting heat to said liquid chemical bath through the wall of said first vessel, a second vessel disposed directly adjacent to said first vessel and having an upper end situated below the level of the upper end of said first vessel, a first fluid fitting disposed in the bottom region of said first vessel and a second fluid fitting disposed in the bottom region of said second vessel, pump and filter means connected between said first and second fluid fittings for pumping a liquid chemical from said bottom region of said second vessel into said bottom region of said first vessel to create an upflow of filtered liquid chemical within said first vessel, a trough extending along the upper extent of at least one side of said first vessel and being inclined downwardly toward said upper end of said second vessel to direct overflow of the liquid chemical from said first vessel into said upper end of said second vessel by gravitational flow of said liquid chemical along said trough, whereby the liquid chemical fills said first vessel and a portion of said second vessel and the liquid chemical entering said first vessel from said pump and filter means causes overflow of the liquid chemical from said first vessel into said trough and thence along said trough and into said second vessel.

2. The recirculating, high purity chemical bath of claim 1, further including a housing enclosing the bottom and sides of said first vessel and second vessel, and thermal insulation disposed within said housing and secured about said first vessel.

3. The recirculating, high purity chemical bath of claim 1, wherein said first and second vessel are integrally formed in a unitary assembly.

4. The recirculating, high purity chemical bath of claim 1, wherein said first vessel is comprised of opposed first side walls and opposed first end walls and a first bottom wall joined to form a generally rectangular fluid container, said second vessel being adjacent one of said end walls, and wherein said trough extends along each of said side walls and the other of said end walls and has ends positioned to release said overflow liquid chemical into said second vessel.

5. The recirculating, high purity chemical bath of claim 4, wherein said trough means comprises a channel having side portions secured to the outer surface of said first side walls and an end portion secured to the outer surface of the other of said first end walls, said channel side portions being inclined downwardly from said end portion toward said second vessel.

6. The recirculating, high purity chemical bath of claim 5, wherein said heater and filter means includes heating elements secured to the outer surface of said first bottom wall and lower portions of said first side walls and which are disposed to heat the liquid chemical within said first vessel.

7. The recirculating, high purity chemical bath of claim 6, further including a housing enclosing said bottom and sides of said first vessel and second vessel, and thermal insulation disposed within said housing and secured about said first vessel.

8. The recirculating, high purity chemical bath of claim 7, further including a rim assembly secured atop an upper edge portion of said housing and extending thereabout, said channel side portion and end portion being disposed on said rim assembly in supported relationship.

* * * * *